ELECTRIC CIRCUIT FOR THE DETECTION AND AMPLIFICATION
OF ELECTROMAGNETIC RADIATION

Filed Jan. 18, 1967

Inventors
DEREK H. MASH
JACK R. PETERS
By
Attorney

United States Patent Office 3,470,378
Patented Sept. 30, 1969

3,470,378

ELECTRIC CIRCUIT FOR THE DETECTION AND AMPLIFICATION OF ELECTROMAGNETIC RADIATION

Derek Hubert Mash and Jack Rowland Peters, Harlow, England, assignors to International Standard Electric Corporation, New York, N.Y., a corporation of Delaware Filed Jan. 18, 1967, Ser. No. 610,128
Claims priority, application Great Britain, Jan. 28, 1966, 3,898/66
Int. Cl. H01j *39/12*
U.S. Cl. 250—211 2 Claims

ABSTRACT OF THE DISCLOSURE

An electric circuit includes a photosensitive varactor, the junction capacitance of which increases when irradiated with light, and the change in capacitance is utilized to bring about a change in power in an AC load.

The invention relates to an electrical circuit for the detection and amplification of electromagnetic radiation.

According to the invention there is provided a photosensor which includes a photosensitive varactor electrically in series with a resistance shunted by a capacitance such that when included in a circuit providing a periodically fluctuating reverse bias voltage, which voltage is comprised of an alternating component and a steady component, to said photosensor and when the photovaractor is irradiated with light which reduces the reverse leakage resistance of the photovaractor, then the capacitance change of the varactor is such that the change in power dissipation in a load included in said circuit is contributed to in a major proportion by the alternating components of current and voltage and in a minor proportion by the steady components of current and voltage.

For the purposes of this specification the term photovaractor is defined to mean a seminconductor device including a p-n junction whose reverse bias resistance is photosensitive and whose junction capacitance is a function of the D.C. potential difference across the device.

This invention has particular but not exclusive application to the manufacture of image converters and image intensifiers.

The fact that the resistance of semiconductive material may be altered by irradiation with light of a suitable wavelength is well known and has given rise to a class of devices known alternatively as photoconductors and photoresistors. However, although the proportional change in resistance with illumination is large, the circulating current is very small and so the change of dissipation in a series connected load is correspondingly small.

This invention discloses a method whereby the change of power dissipation in a series connected load due to a change in resistance of a semiconductor device when irradiated, is augmented by a larger change in dissipation occasioned by the change in capacitance across the device.

The features of the invention will be evident in the following description of an embodiment thereof. The description refers to the drawings accompanying the specification in which.

Figure 1:
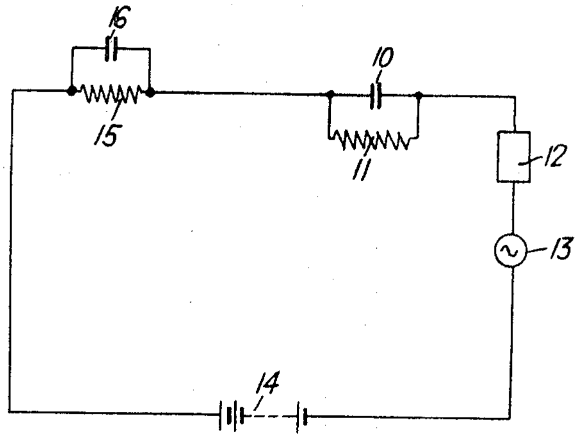
FIGURE 1 shows a circuit diagram of a photosensor.

Referring to FIGURE 1 the circuits consist of a photovaractor diode, represented as a junction capacitance 10 in parallel with a photo-resistance 11, in series with a load 12, an alternating voltage supply 13, a battery 14 and a source resistance 15 which is shunted by a capacitor 16. The source resistance 15 is chosen to have a value comparable with that of the photovaractor diode, so that the diode is effectively driven by a current generator and hence any change of the diode's resistance results in a change of potential difference across the diode. The capacitor 16 is chosen to have a sufficiently large value to provide a low impedance path shunting the source resistance 15 for the A.C. supply 13.

When light is absorbed in the reverse-biased junction of the diode free carriers are formed, resulting in an increase of leakage current, decrease of the effective junction resistance, and, since the steady part of the reversed bias is supplied from a constant current source, the change in junction resistance results in a reduction of the potential drop across it. However, since with varactor diodes junction capacitance varier inversely with the reverse voltage bias the effect of the incident light under these circumstances will be to increase the junction capacitance.

The photocurrent itself is normally very small for any reasonable applied voltage and would need amplification before use. However, the change in capacitance produced may be used to control an alternating current in an external circuit if a small alternating voltage 13 is applied additional to the steady voltage bias provided by the battery 14 and if also the source resistance 15 is shunted by a large value capacitor 16 to provide a low impedance path for the alternating current. The magnitude of the alternating voltage must, of course, be insufficient for the varactor to become forward biassed at any part of the cycle. The magnitude of the alternating current will then be a function of the junction capacitor 10 and the frequency of the applied alternating voltage, and since the power developed in a load 12 in the circuit is proportional to the square of the current, the higher the fregenerate very small direct currents and hence little power, available. Consequently, low levels of incident light which generate very small direct currents and hence little power, can be used in the manner as hereinbefore described to change large alternating currents and hence control much larger powers.

It is possible to further increase the change of the power in the load, on illumination of the photovaractor, by including in the circuit an inductance resonating with the photovaractor capacitance at or near the frequency of the alternating voltage. In this case changes in the junction capacitance can be made to result in a decrease or an increase of the alternating current, on whether the change takes the circuit away from or towards the resonant condition.

Figure 2:
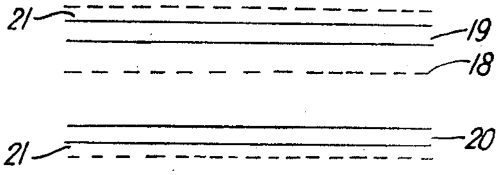
FIGURE 2 shows in cross section a stack of layers, forming an image intensifier or converter, and being a particular realisation of the whole of the circuit of FIGURE 1 excluding the voltage sources.

If no inductor is used, the elements of the circuit are compatible with a geometry of an image intensifier or converter as shown in FIGURE 2. Thus the photovaractor p-n junction itself may be an extensive area 18 and the source resistance and its associated shunting capacitor may be a thin film 19 of a suitable high resistance material, chosen such that its resistivity thickness and dielectric constant give it the required properties equivalent to the source resistance 15 shunted by the capacitor 16 of FIGURE 1. A layer 20 of electro-luminescent material such as zinc sulphide, which is responsive to alternating current, provides the equivalent to the load 12 of FIGURE 1. The device is completed by the provision of electrodes 21 suitable for applying direct and alternating voltage bias to the device. Since radiation is required to reach the junction 18 the electrode 21 in contact with the layer 19 and the layer 19 itself must both be at least partially transparent. The electrode may for example be made of conducting glass.

The resulting device is a stack of layers incorporating a thin photosensitive layer adjacent to a thin electroluminescent layer, so illumination confined to a discrete area of the photovaractor will activate a substantially equivalent discrete area of the electroluminescent layer, and so the device as a whole may be used as an image intensifier or image converter according to the response of the photovaractor and the electroluminescent layer as determined by the choice of their materials.

In certain circumstances it will be possible to omit the resistive film 19. This will occur when the electroluminescent layer itself provides the electrical characteristics appertaining to the source resistance 15 shunted by the capacitance 16 of the equivalent circuit of FIGURE 1.

What we claim is:

1. A photosensor device comprising a transparent conductive layer of relatively high resistance and low impedance, a photosensitive layer on said conductive layer including a semiconductor P-N junction area having a capacitance which varies inversely with reverse bias voltage and a resistance which varies inversely with light applied to said junction, an electroluminescent layer on said photosensitive layer responsive to alternating current, and voltage supply means applying alternating current and voltage and direct reverse bias voltage to said layers and junction in a series connection, the magnitude of said alternating voltage being less than that required to apply a forward bias to said photosensitive layer, the capacitance change of said junction being such that the alternating current and voltage provide the major proportion of the change in power in said electroluminescent layer.

2. A photosensor as claimed in claim 1 wherein the electroluminescent material is zinc sulphide.

References Cited

UNITED STATES PATENTS

| | | | |
|---|---|---|---|
| 3,011,089 | 11/1961 | Reynolds. | |
| 3,029,346 | 4/1962 | Uchida et al. | 250—213 |
| 3,049,622 | 8/1962 | Ahlstrom et al. | |
| 3,293,441 | 12/1966 | Kazan et al. | 250—213 |
| 3,300,645 | 1/1967 | Winslow | 250—213 |

OTHER REFERENCES

Lindemann and Mueller, Grain-Boundary Photoresponse, Journal of Applied Physics. vol. 31, No. 10, 1746–1751, October 1960.

RALPH G. NILSON, Primary Examiner

C. M. LEEDOM, Asistant Examiner

U.S. Cl. X.R.

250—209, 213; 313—108; 317—246